United States Patent [19]

Minato et al.

[11] Patent Number: 5,691,690
[45] Date of Patent: Nov. 25, 1997

[54] CHIP TYPE JUMPER

[75] Inventors: Hiroaki Minato; Toshihiro Mori, both of Kyoto, Japan

[73] Assignee: Rohm Co. Ltd., Kyoto, Japan

[21] Appl. No.: 265,945

[22] Filed: Jun. 27, 1994

[30] Foreign Application Priority Data

Jun. 30, 1993 [JP] Japan ................... 5-189229

[51] Int. Cl.$^6$ .................... H01C 1/012; H01L 23/02
[52] U.S. Cl. .................... 338/309; 174/52.4
[58] Field of Search .................... 338/203, 204, 338/205, 226, 227, 228, 321, 322, 323, 324, 326, 327, 308, 309, 254; 174/52.2, 250; 361/778, 805, 806, 303, 306.3, 312, 313

[56] References Cited

U.S. PATENT DOCUMENTS

| | | | |
|---|---|---|---|
| 4,529,960 | 7/1985 | Uchida et al. | 338/309 |
| 4,684,916 | 8/1987 | Ozawa | 338/308 |
| 4,780,702 | 10/1988 | Snel et al. | 338/308 |
| 4,792,781 | 12/1988 | Takahashi et al. | 338/307 |
| 5,408,379 | 4/1995 | Oguchi et al. | 361/55 |

Primary Examiner—Kristine L. Kincaid
Assistant Examiner—Hung V. Ngo
Attorney, Agent, or Firm—Michael D. Bednarek; Kilpatrick Stockton LLP

[57] ABSTRACT

A chip type jumper is provided which includes an insulating chip substrate, a single-layered conductor film formed on a surface of the chip substrate, a pair of side electrodes formed at selected edges of the chip substrate in electrical connection with the conductor film, and a protective member covering the conductor film between the pair of side electrodes.

8 Claims, 5 Drawing Sheets 5,691,690

CHIP TYPE JUMPER

BACKGROUND OF THE INVENTION

1. Field of the Invention

This invention relates to a chip type jumper wherein a conductor film is formed on an insulating chip substrate by applying a conductive paste.

2. Description of the Related Art

A chip type jumper is an electronic chip component which is used for shorting between two terminal pads in the circuitry of a printed circuit board. Because of its shorting function, the chip type jumper has a very low resistivity (i.e., very high conductance). Like other electronic chip components, the chip type jumper can be conveniently mounted to a printed circuit board by an automatic chip mounter.

As shown in FIG. 5 of the accompanying drawings, a prior art chip type jumper comprises a rectangular insulating chip substrate 11 made of a ceramic material such as alumina, and a first or base conductor layer 12a formed on the upper surface of the substrate 11, and a second or overcoat conductor layer 12b formed on the first conductor layer 12a.

Each end of the first conductor layer 12a is connected to a side electrode 13 extending along an edge of the chip substrate 11. The side electrode 13 has an upper wing 13a overlying the relevant end of the first conductor layer 12. The side electrode 13 also has a lower wing 13b extending onto the lower surface of the substrate 11 for conveniently mounting on a terminal pad P1 of a printed circuit board P by soldering S. The second conductor layer 12b is entirely covered by a protective layer 14 made of glass.

A plurality of such chip type jumpers may be produced in the following manner.

First, as shown in FIG. 6a, a green ceramic sheet (master substrate) 11' made of e.g. alumina is prepared. The green sheet 11' is formed with a plurality of longitudinal breaking grooves 15a, and a plurality of transverse breaking grooves 15b intersecting the longitudinal breaking grooves 15a.

Then, as shown in FIG. 6b, a silver-palladium conductive paste 12a' is applied to the green sheet 11' continously in a strip form between and along each two adjacent longitudinal breaking lines 15a by printing. The conductive paste 2' thus applied is fixed by subsequent baking.

Then, as shown in FIG. 6c, a silver-palladium conductive paste 12b' is additionally applied to the undercoat conductor strip 12a' in the form of islands between each two adjacent longitudinal breaking lines 15a. The conductive paste islands 12b' thus applied are fixed by subsequent baking.

Then, as shown in FIG. 6d, a borosilicate flint glass paste 14a' is printed over the baked conductive paste islands 12b' continously in a strip form between and along each two adjacent transverse breaking lines 15b.

Then, the master substrate 11' is divided into a plurality of chip substrates 11 (FIG. 5) by breaking along the respective breaking lines 15a, 15b.

Finally, each end of each chip substrate 11 (FIG. 5) is subjected to formation of a side electrode 13 again in a conventional manner.

According to the prior art described above, the first and second conductor layers 12a, 12b are relatively thin individually but provide a combined thickness which is enough for lowering the resistance of the jumper as required for performing its intended function of shorting. However, the prior art jumper has been found to be disadvantageous in the following points.

Having different coefficients of thermal expansion, the chip substrate 11, the conductor layers 12a, 12b, and the protective layer 14 expands and contracts to different degrees when subjected to a temperature elevation upon melting the solder S and a subsequent temperature drop upon solidifying the solder S. It has been experimentally found that a stress concentration tends to occur at a stepped portion X (see FIG. 5) between the first and second conductor layers 12a, 12b. Such a stress concentration may often result in layer-layer separation at the interface between the two conductor layers 12a, 12b as well as between the second conductor layer 12b and the protective layer 14.

According to the prior art, only the first conductor layer 12a is effective for adhering to the chip substrate 11. It has been found that when the conductor layer is made of a conductive paste, the strength of adhesion between the conductor layer and the chip substrate 11 depends not only on the adhesion area but also on the thickness of the conductor layer. Thus, since the first conductor layer 12a alone is relatively thin, the adhesion of the first conductor layer 12a relative to the chip substrate 11 is insufficient. As a result, the first conductor layer 12a together with each side electrode 13 intergrated therewith may be broken or damaged when a pulling force is applied to the side electrode 13 upon solidification (accompanied by contraction) of the solder fillet S.

SUMMARY OF THE INVENTION

It is, therefore, an object of the present invention to provide a chip type jumper which is capable of eliminating or mitigating the above-described problems of the prior art jumper.

According to the present invention, there is provided a chip type jumper comprising: an insulating chip substrate; a single-layered conductor film formed on a surface of the chip substrate; a pair of side electrodes formed at selected edges of the chip substrate in electrical connection with the conductor film; and a protective member covering the conductor film between the pair of side electrodes.

Preferably, the conductor film is made of silver-palladium paste with a thickness of not less than 12 micrometers to provide a resistance of not more than 50 mΩ, preferably 20–25 mΩ.

In one embodiment, the protective member includes a first protective layer directly formed on the conductor film, and a second protective layer formed on the first protective layer. Each of the first and second protective layers may be advantageously made of borosilicate flint glass. The second protective layer may be equal in length to the first protective layer but narrower than the first protective layer.

Other objects, features and advantages of the present invention will become apparent from the following detailed description of the preferred embodiments given with reference to the accompanying drawings.

DETAILED DESCRIPTION OF THE PREFERRED EMBODIMENTS

Figure 1:
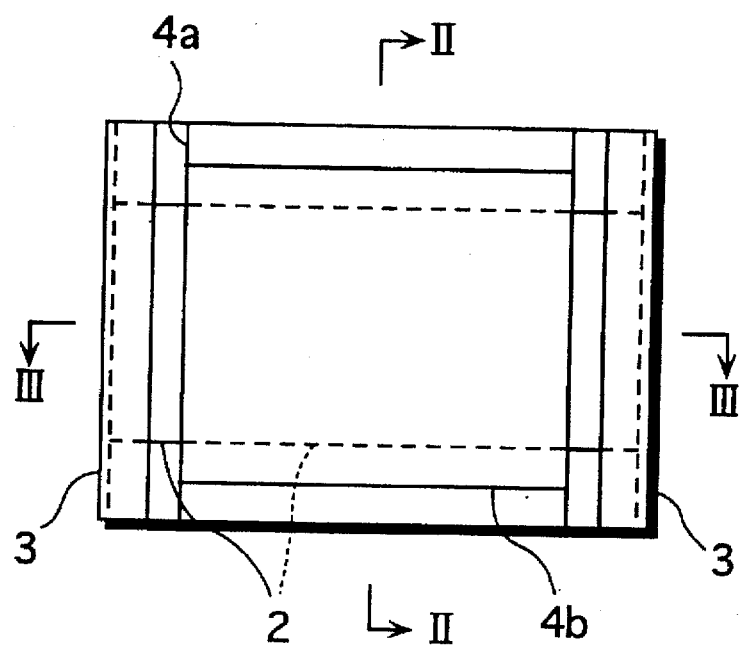
FIG. 1 is a plan view showing a chip type jumper according to an embodiment of the present invention.
Figure 2:
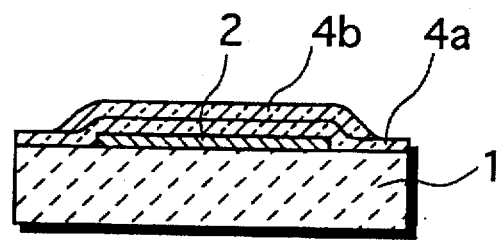
FIG. 2 is a sectional view taken along lines II—II in FIG. 1.
Figure 3:
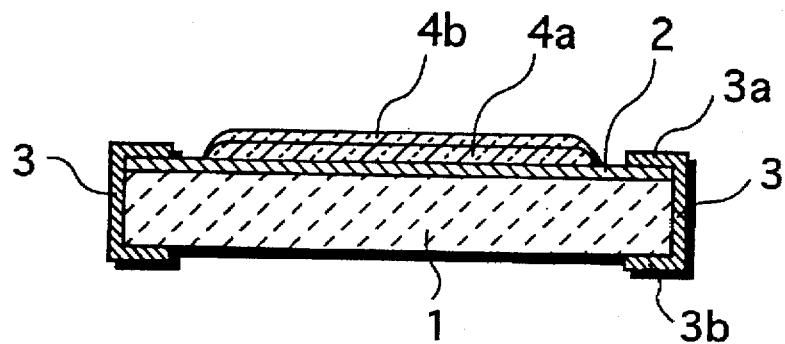
FIG. 3 is a sectional view taken along lines III—III in FIG. 1.

Referring first to FIGS. 1 through 3 of the accompanying drawings, there is illustrated a chip type jumper embodying the present invention. The jumper comprises a rectangular insulating substrate 1 made of a ceramic material such as alumina. This substrate is a chip for carrying the components to be described below.

The jumper comprises a single-layered conductor film 2 formed on the upper surface of the substrate 1 by printing a silver-palladium paste for example and then baking the paste for fixation. The conductor film 2 is in the form of a strip which is equal in length to the substrate 1 but smaller in width than the substrate.

Because of the single layer structure, the conductor film 2 itself need to have a relatively large thickness of not less than 12 micrometers to provide a relatively small resistance (i.e., a relatively large conductance) of not larger than 50 m$\Omega$, preferably 20–25 m$\Omega$. Such a thickness corresponds generally to the combined thickness of the two conductor layers 12a, 12b (see FIG. 5) of the prior art jumper previously discussed. There is no specific upper limit for the thickness of the conductor film 2, but the need for making the conductor film 2 single-layered provides a certain technical limit for the maximum thickness of the conductor film 2.

Each end of the conductor film 2 is connected to a side electrode 3 (see FIG. 3) extending over the full width of the substrate 1 at a corresponding shorter edge thereof (see FIG. 1). The side electrode 3 has an upper wing 3a overlying the relevant end of the conductor film 2. The side electrode 3 also has a lower wing 3b extending onto the lower surface of the substrate 1 (see FIG. 3) for conveniently mounting on a surface of a printed circuit board (not shown). The exposed surfaces of the side electrode 3 are provided with metal plating (not shown) for facilitating subsequent mounting of the jumper to the unillustrated circuit board by soldering.

The conductor film 2 is centrally covered by a first protective layer 4a which is in turn covered by a second protective layer 4b. The respective protective layers 4a, 4b may be preferably made of borosilicate flint glass (borosilicate lead glass) for example. The first protective layer 4a is equal in width to the substrate 1 but has a length which is shorter than the distance between the respective side electrodes 3. The second protective layer 4b is equal in length to the first protective layer 4a but narrower than the first protective layer 4a. The second protective layer 4b prevents the first protective layer 4a from chipping and/or cracking.

A plurality of chip type jumpers each having the above-described structure may be produced simultaneously in the following manner.

Figure 4A:
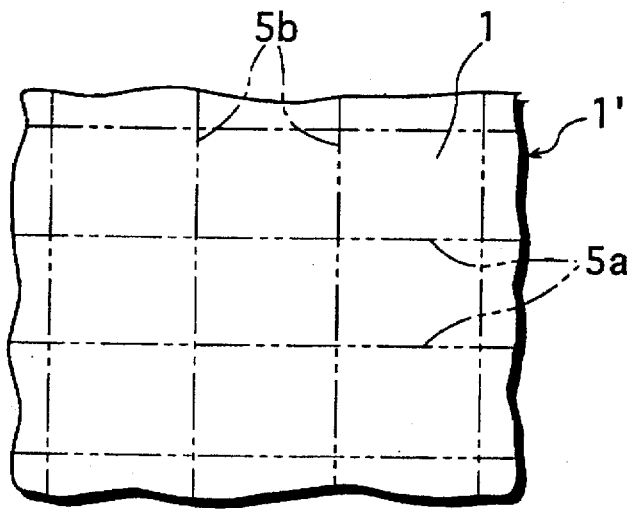
FIGS. 4a through 4d are views showing the successive steps of making chip type jumpers according to the present invention.

First, as shown in FIG. 4a, a green ceramic sheet (master substrate) 1' made of e.g. alumina is prepared. The green sheet 1' is formed with a plurality of longitudinal breaking grooves 5a, and a plurality of transverse breaking grooves 5b intersecting the longitudinal breaking grooves 5a. Each of the regions obtained by dividing at the respective breaking lines 5a, 5b corresponds to the chip substrate 1 shown in FIGS. 1 to 3. The respective breaking lines 5a, 5b may be formed by press-working or by scribing.

Figure 4B:
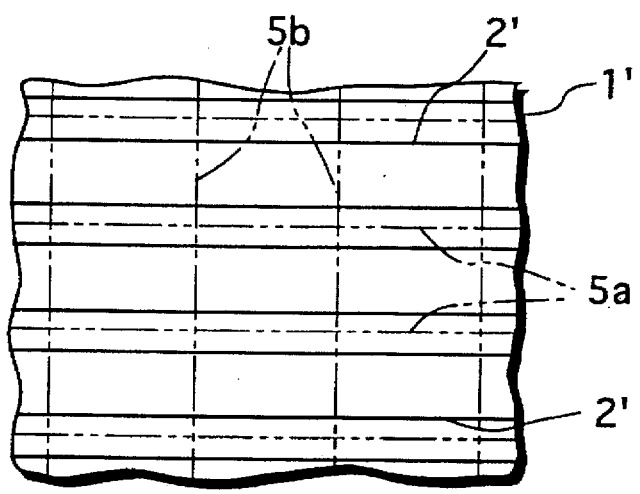

Then, as shown in FIG. 4b, a silver-palladium conductive paste 2' is applied to the green sheet 1' continously in a single-layered strip between and along each two adjacent longitudinal breaking lines 5a by printing. The conductive paste 2' thus applied is fixed by subsequent baking. As previously described, the conductive paste 2' has a thickness of not less than 12 micrometers. Apparently, each of the portions of the fixed conductive paste 2' obtained by dividing at the transverse breaking grooves 5b corresponds to the conductor film 2 shown in FIGS. 1–3.

Figure 4C:
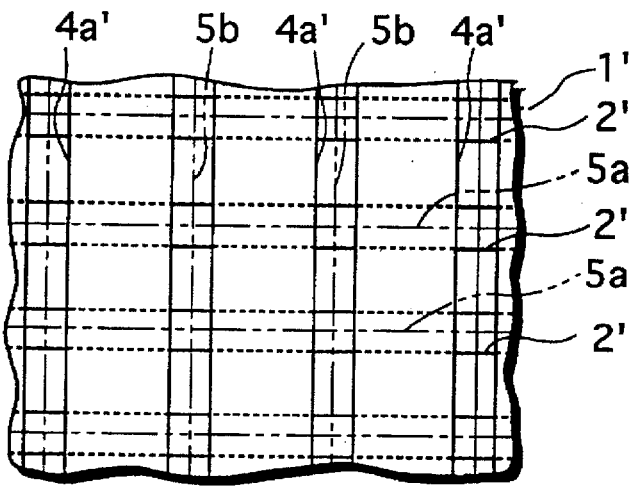

Then, as shown in FIG. 4c, a borosilicate flint glass paste 4a' is printed over the baked conductive paste strip 2' continously in a strip form between and along each two adjacent transverse breaking lines 5b by printing. The glass paste 4a' thus applied is fixed by subsequent baking. Apparently, each of the portions of the fixed glass paste 4a' obtained by dividing at the longitudinal breaking grooves 5a corresponds to the first protective layer 4a (FIGS. 1–3).

Figure 4D:
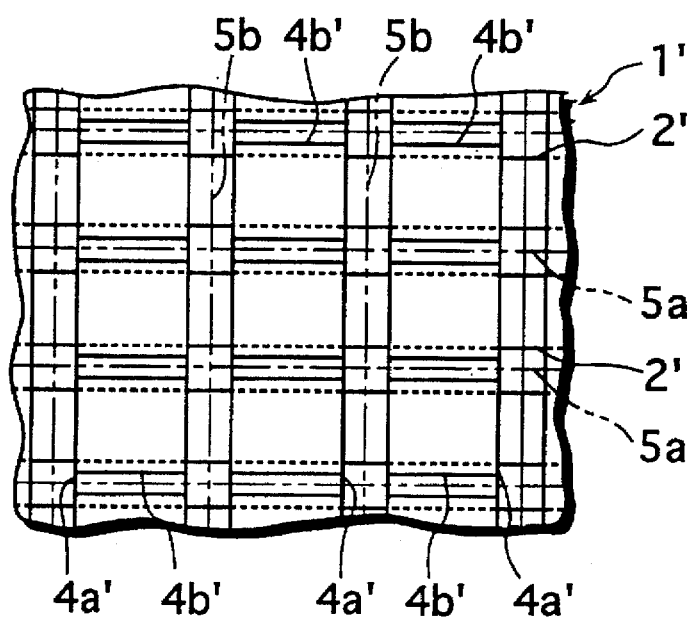

Then, as shown in FIG. 4d, a similar borosilicate flint glass paste 4b' is printed on the fixed glass paste strip 4a' in the form of islands between the respective longitudinal breaking lines 5a and between each two adjacent transverse breaking lines 5b, and the printed glass paste islands 4b' are baked for fixation. Apparently, each of the glass paste islands 4b' corresponds to the second protective layer 4b shown in FIGS. 1 to 3.

Then, the master substrate 1' is divided into a plurality of chip substrates 1 (see FIGS. 1–3) by breaking along the respective breaking lines 5a, 5b. Such a breaking operation may be performed by a conventional method using a substrate dividing apparatus which incorporates pressing rollers. Such a substrate dividing apparatus is disclosed in Japanese Patent Publication No. 63(1988)-32602 or Japanese Utility Model Publication No. 3(1991)-56004 for example.

Finally, each end of each chip substrate 1 (FIGS. 1–3) is subjected to formation of a side electrode 3 again in a conventional manner.

According to the embodiment described above, the single-layered conductor film 2 (FIGS. 1–3) can be formed very easily in a single operation of printing and baking the conductive paste 2' (FIG. 4b). Thus, the production process can be performed very efficiently, and the production cost can be correspondingly reduced.

Figure 5:
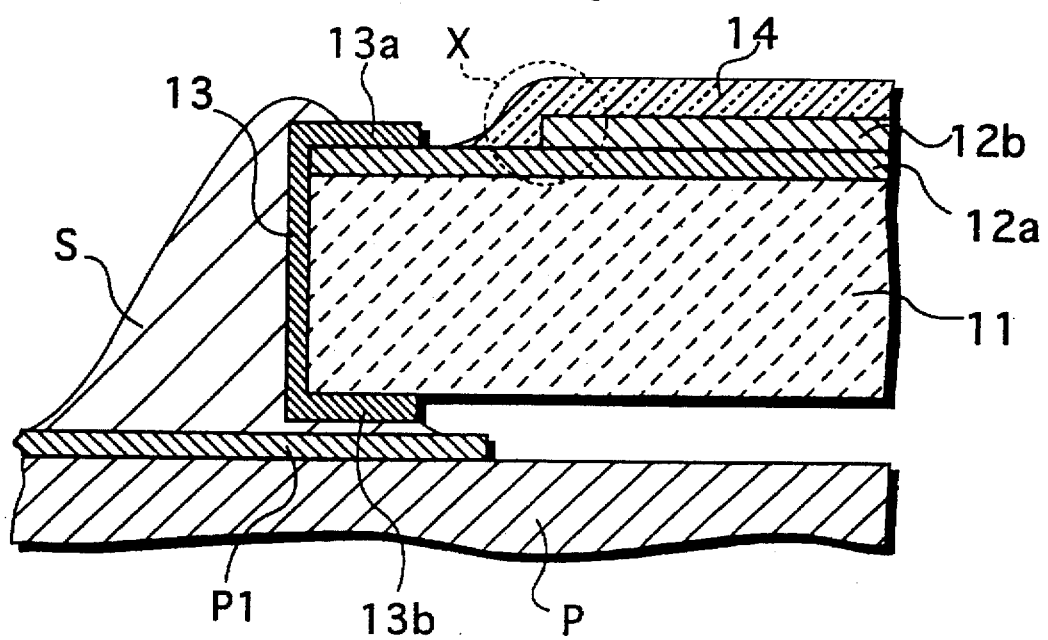
FIG. 5 is a fragmentary sectional view showing a prior art chip type jumper; and, FIGS. 6a through 6d are views showing the successive steps of making a plurality of such prior art jumpers.
Figure 6A:
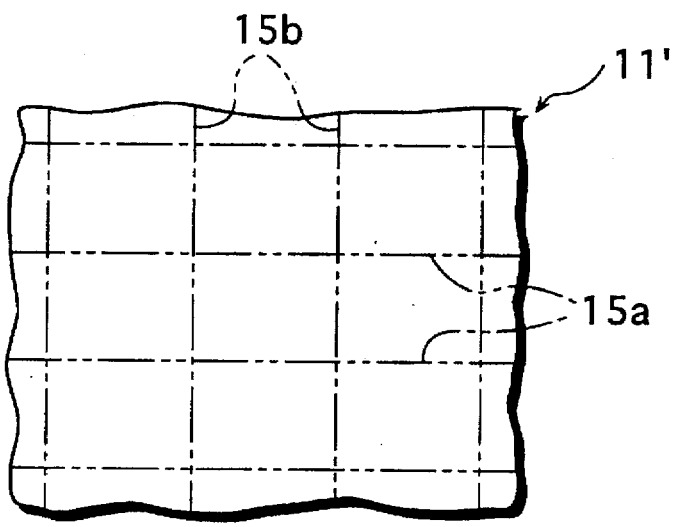
Figure 6B:
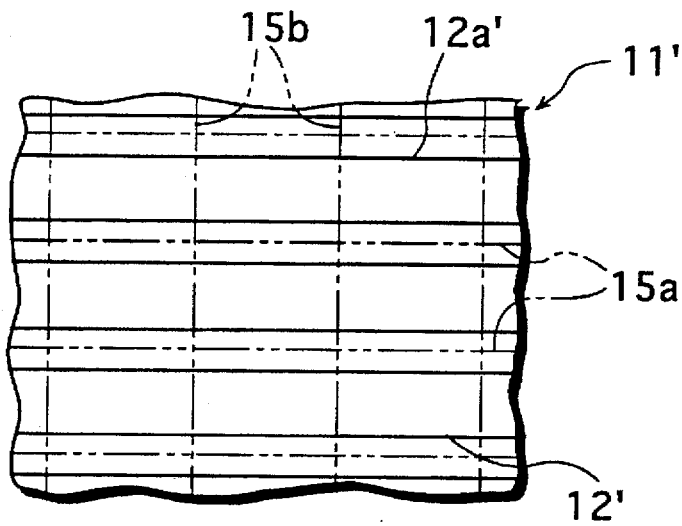
Figure 6C:
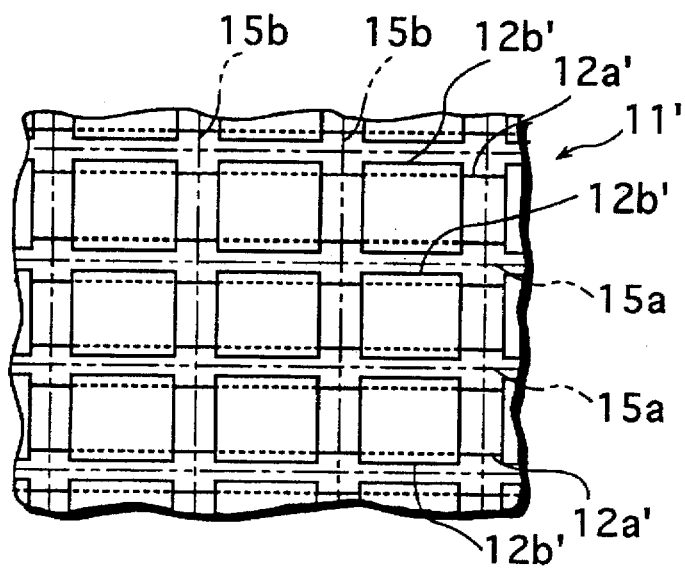
Figure 6D:
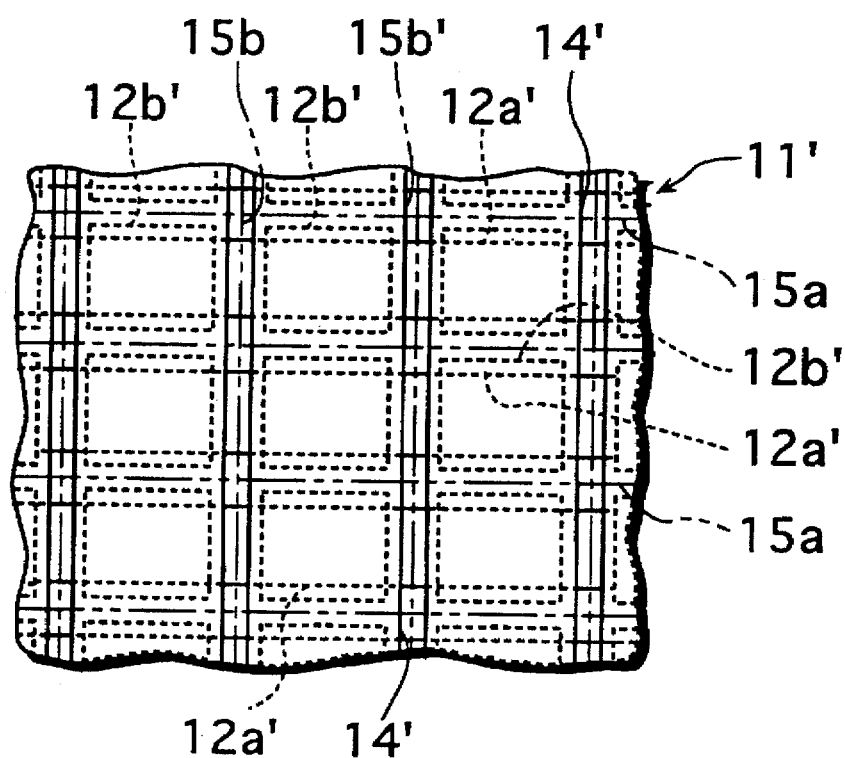

More importantly, the single-layered conductor film 2 has no stepped portion of its own where stresses would concentrate due to a difference of thermal expansion between different members at the time of soldering the jumper to the unillustrated circuit board. Thus, the conductor film 2 itself is free from layer-layer separation which is encountered in the prior art jumper (FIG. 5).

Further, since the single-layered conductor film 2 has a thickness larger than the base conductor layer 12a (FIG. 5) of the prior art, the single-layered conductor film 2 has a stronger adhesion to the chip substrate 1 (due to the use of an increased amount of conductive paste in a single paste applying operation) and provides a higher mechanical strength. Thus, the single-layered conductor film 2 together with each side electrode 3 intergrated therewith is unlikely to be broken or damaged even if a pulling force is applied to the side electrode 3 upon solidification (accompanied by contraction) of solder (not shown) used for mounting the jumper.

The preferred embodiment of the present invention being thus described, it is obvious that the same may be varied in many ways. Such variations are not to be regarded as a departure from the spirit and scope of the the invention, and all such modifications as would be obvious to those skilled in the art are intended to be included within the scope of the following claims.

We claim:

1. A chip type jumper comprising:

an insulating chip substrate;

a conductor film formed on a surface of said chip substrate;

a pair of side electrodes formed at respective edges of said chip substrate in electrical connection with said conductor film; and a protective member covering said conductor film between said pair of side electrodes;

wherein said protective member comprises a first protective layer formed directly on said conductor film, and a second protective layer formed on said first protective layer; and wherein said second protective layer has a length equal to that of said first protective layer, but a width that is narrower than that of said first protective layer.

2. The jumper according to claim 1, wherein said conductor film is no less than 12 micrometers thick.

3. The jumper according to claim 1, wherein a resistance of said conductor film is not more than 50 m$\Omega$.

4. The jumper according to claim 1, wherein said conductor film is made of conductive silver-palladium paste.

5. The jumper according to claim 1, wherein said conductor film is in the form of a strip.

6. The jumper according to claim 1, wherein said chip substrate is made of a ceramic material.

7. The jumper according to claim 1, wherein said conductor film is a single layer of material.

8. A chip type jumper comprising:

an insulated chip substrate;

a conductor film formed on a surface of said chip substrate;

a pair of side electrodes formed at respective edges of said chip substrate in electrical connection with said conductor film; and a protective member covering said conductor film between said pair of side electrodes;

wherein said protective member comprises a first protective layer formed directly on said conductor film, and a second protective layer formed on said first protective layer; and wherein said first and second protective layers are each made of borosilicate flint glass.

* * * * *